(12) United States Patent
Hennus et al.

(10) Patent No.: US 8,115,905 B2
(45) Date of Patent: Feb. 14, 2012

(54) LITHOGRAPHIC APPARATUS AND DEVICE MANUFACTURING METHOD

(75) Inventors: Pieter Renaat Maria Hennus, Peer (BE); Jeroen Johannes Sophia Maria Mertens, Duizel (NL); Patrick Johannes Cornelus Hendrik Smulders, Best (NL); Peter Smits, Baarlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/076,731

(22) Filed: Mar. 21, 2008

(65) Prior Publication Data

US 2008/0174752 A1 Jul. 24, 2008

Related U.S. Application Data

(63) Continuation of application No. 11/006,550, filed on Dec. 8, 2004, now Pat. No. 7,365,827.

(51) Int. Cl.
*G03B 27/58* (2006.01)
*G03B 27/52* (2006.01)

(52) U.S. Cl. .............. 355/72; 355/30; 355/53

(58) Field of Classification Search .......... 355/53, 355/72, 75, 30; 277/345, 353
See application file for complete search history.

(56) References Cited

U.S. PATENT DOCUMENTS

| | | | |
|---|---|---|---|
| 2,759,254 A * | 8/1956 | Soehnlen et al. | 29/890.147 |
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 4,744,634 A * | 5/1988 | Fink | 359/577 |
| 5,040,020 A | 8/1991 | Rauschenbach et al. | |
| 5,121,256 A | 6/1992 | Corle et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,480,260 B1 * | 11/2002 | Donders et al. | 355/53 |
| 6,560,032 B2 | 5/2003 | Hatano | |
| 6,597,433 B1 | 7/2003 | Renkens et al. | |
| 6,600,547 B2 | 7/2003 | Watson et al. | |
| 6,603,130 B1 | 8/2003 | Bisschops et al. | |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Hung Henry Nguyen
*Assistant Examiner* — Steven H Whitesell Gordon
(74) *Attorney, Agent, or Firm* — Pillsbury Winthrop Shaw Pittman LLP (57) ABSTRACT

A lithographic apparatus for immersion lithography is disclosed in which a seal between different parts of the substrate table may be arranged to reduce the transmission of forces between the different parts.

19 Claims, 4 Drawing Sheets

U.S. PATENT DOCUMENTS

| | | | |
|---|---|---|---|
| 6,633,365 | B2 | 10/2003 | Suenaga |
| 6,736,406 | B1 * | 5/2004 | Provencher ............... 277/628 |
| 7,199,858 | B2 * | 4/2007 | Lof et al. ............... 355/30 |
| 7,365,827 | B2 * | 4/2008 | Hennus et al. ............... 355/53 |
| 7,684,010 | B2 * | 3/2010 | Smulders et al. ............... 355/53 |
| 2002/0020821 | A1 | 2/2002 | Van Santen et al. |
| 2002/0163629 | A1 | 11/2002 | Switkes et al. |
| 2003/0123040 | A1 | 7/2003 | Almogy |
| 2003/0174408 | A1 | 9/2003 | Rostalski et al. |
| 2004/0000627 | A1 | 1/2004 | Schuster |
| 2004/0021844 | A1 | 2/2004 | Suenaga |
| 2004/0075895 | A1 | 4/2004 | Lin |
| 2004/0109237 | A1 | 6/2004 | Epple et al. |
| 2004/0114117 | A1 | 6/2004 | Bleeker |
| 2004/0119954 | A1 | 6/2004 | Kawashima et al. |
| 2004/0125351 | A1 | 7/2004 | Krautschik et al. |
| 2004/0135099 | A1 | 7/2004 | Simon et al. |
| 2004/0136494 | A1 | 7/2004 | Lof et al. |
| 2004/0160582 | A1 | 8/2004 | De Smit et al. |
| 2004/0165159 | A1 | 8/2004 | Lof et al. |
| 2004/0207824 | A1 | 10/2004 | Lof et al. |
| 2004/0211920 | A1 | 10/2004 | Derksen et al. |
| 2004/0239954 | A1 | 12/2004 | Bischoff |
| 2004/0263809 | A1 | 12/2004 | Nakano |
| 2005/0007569 | A1 | 1/2005 | Streefkerk et al. |
| 2005/0018155 | A1 | 1/2005 | Cox et al. |
| 2005/0024609 | A1 | 2/2005 | De Smit et al. |
| 2005/0030497 | A1 | 2/2005 | Nakamura |
| 2005/0046813 | A1 | 3/2005 | Streefkerk et al. |
| 2005/0046934 | A1 | 3/2005 | Ho et al. |
| 2005/0052632 | A1 | 3/2005 | Miyajima |
| 2005/0094116 | A1 | 5/2005 | Flagello et al. |
| 2005/0094125 | A1 | 5/2005 | Arai |
| 2005/0110973 | A1 | 5/2005 | Streefkerk et al. |
| 2005/0122505 | A1 | 6/2005 | Miyajima |
| 2005/0132914 | A1 | 6/2005 | Mulkens et al. |
| 2005/0134815 | A1 | 6/2005 | Van Santen et al. |
| 2005/0134817 | A1 | 6/2005 | Nakamura |
| 2005/0140948 | A1 | 6/2005 | Tokita |
| 2005/0146693 | A1 | 7/2005 | Ohsaki |
| 2005/0146694 | A1 | 7/2005 | Tokita |
| 2005/0151942 | A1 | 7/2005 | Kawashima |
| 2005/0200815 | A1 | 9/2005 | Akamatsu |
| 2005/0213065 | A1 | 9/2005 | Kitaoka |
| 2005/0213066 | A1 | 9/2005 | Sumiyoshi |
| 2005/0219489 | A1 | 10/2005 | Nei et al. |
| 2005/0233081 | A1 | 10/2005 | Tokita |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 860 861 | 8/1998 |
| EP | 1039511 | 9/2000 |
| EP | 1 429 188 | 6/2004 |
| EP | 1 586 948 | 10/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2003-263751 A | 9/2003 |
| JP | 2004-193252 | 7/2004 |
| JP | 2004-289127 A | 10/2004 |
| JP | 2005116571 | 4/2005 |
| JP | 2005-191557 A | 7/2005 |
| JP | 2005-259870 A | 9/2005 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst*(1):7-12 (2002).

European Search Report for European Application No. 05 25 7410, dated May 15, 2006.

Notice of Reasons for Rejection for Japanese Patent Application No. 2005-353110 dated Aug. 18, 2008.

Notice of Reasons for Rejection for Japanese Patent Application No. 2009-033893 dated Jun. 15, 2009.

* cited by examiner

LITHOGRAPHIC APPARATUS AND DEVICE MANUFACTURING METHOD

This application is a continuation of U.S. patent application Ser. No. 11/006,550 filed on Dec. 8, 2004, which is herein incorporated by reference in its entirety.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
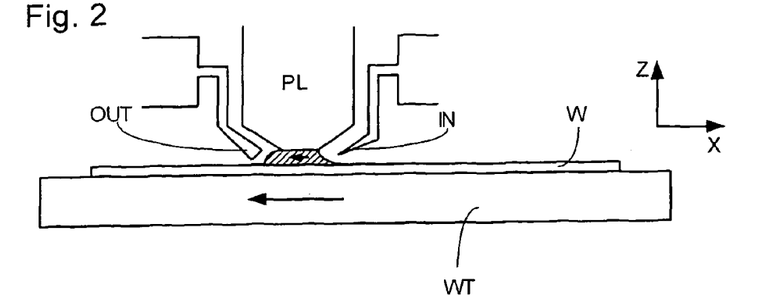
FIGS. 2 and 3 depict a liquid supply system for used in a lithographic projection apparatus.
Figure 3:
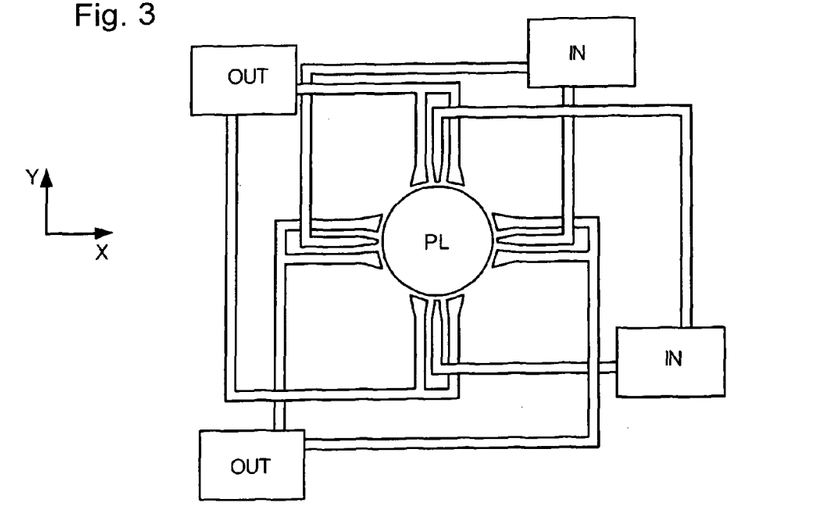

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Of course handling liquids in an immersion apparatus creates specific difficulties. In particular, delicate parts of the substrate table must be liquidproofed against ingress of immersion liquid.

SUMMARY

Accordingly, it would be advantageous, for example, to seal between different parts of the substrate table. In particular, it is desirable to have seals which do not transmit forces between the parts of the substrate table between which the seals extend.

According to an aspect of the invention, there is provided a lithographic projection apparatus, comprising:
  a substrate table configured to hold a substrate;
  a first part of the substrate table having a flexible projection attached; and
  a second part of the substrate table having a clamping device configured to attract and hold a free end of the projection to create a seal between the first part and the second part.

According to an aspect of the invention, there is provided a lithographic projection apparatus, comprising:
  a substrate table configured to hold a substrate; and
  a seal projection attached at one end to the substrate table and removably held in place at the other end by a clamp on the substrate table.

According to an aspect of the invention, there is provided a lithographic apparatus, comprising:
  a substrate table configured to hold a substrate;
  a sensor positioned on the substrate table;
  a seal structure positioned between the sensor and the substrate table, the seal structure being adhered at one end to the sensor and at another end to the substrate table.

According to an aspect of the invention, there is provided a device manufacturing method, comprising:
  clamping an end of a flexible projection using a clamping device positioned on a first part of a substrate table to form a seal between the first part and a second part of the substrate table; and
  projecting a patterned beam of radiation onto a substrate held on the substrate table.

According to an aspect of the invention, there is provided a device manufacturing method, comprising:
  projecting a beam of radiation onto a sensor, wherein a seal structure is positioned between the sensor and a substrate table configured to hold a substrate, the seal structure being adhered at one end to the sensor and at another end to the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
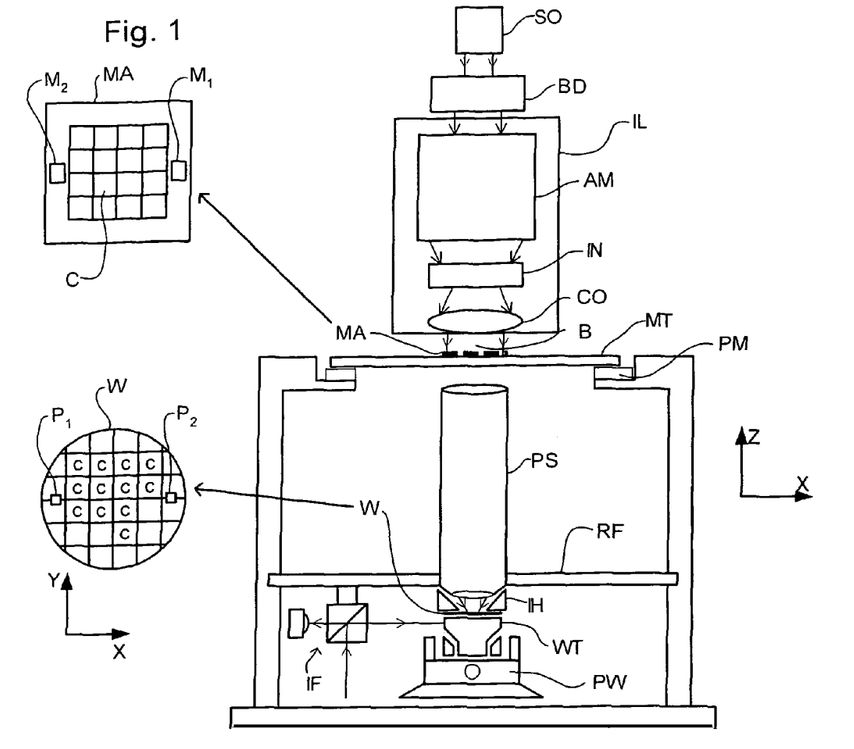
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation).
- a support structure (e.g. a mask table) MT constructed to hold a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Mask MA and substrate W may be aligned using patterning device alignment marks M1, M2 and substrate alignment marks PI, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
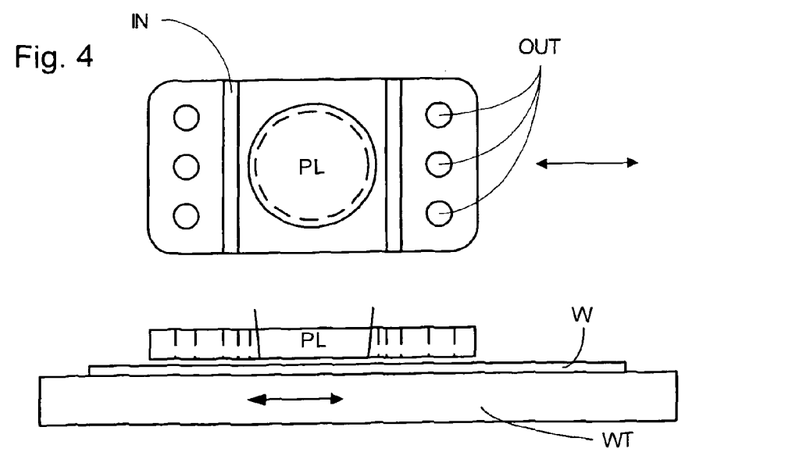
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
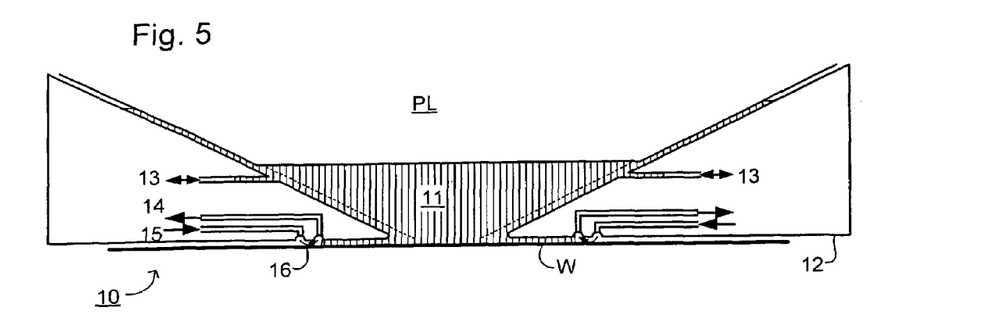
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas.

Figure 6:
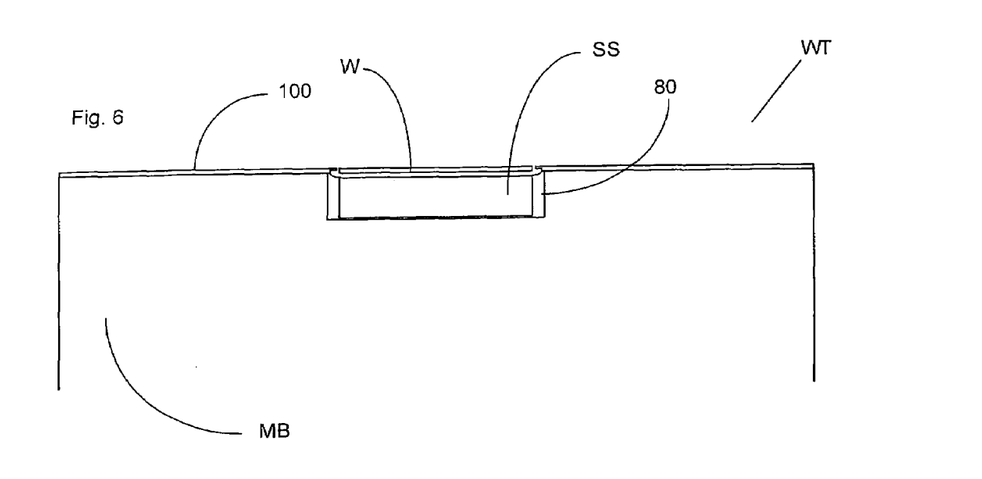
FIG. 6 depicts, in cross-section, a substrate table according to an embodiment of the present invention.

FIG. 6 illustrates a substrate table WT. The substrate table WT comprises a substrate table body MB, which in an embodiment is a mirror block that carries one or mirrors for an interferometer system such that the position of the substrate W can be calculated. The substrate table body MB may also house one or more actuators configured to position the substrate W. The substrate W is held by a substrate support SS which is positioned in a recess 80 in the top surface of the substrate table body MB. The substrate support SS is conventionally a so called pimple or burl table which comprises a plurality of projections on upper and lower surfaces. A vacuum or under pressure is applied in the regions between the pimples to hold the substrate support SS to the substrate table body MB and to hold the substrate W to the substrate support SS. In an embodiment, the substrate support SS may be integral to the substrate table body MB.

Figure 8:
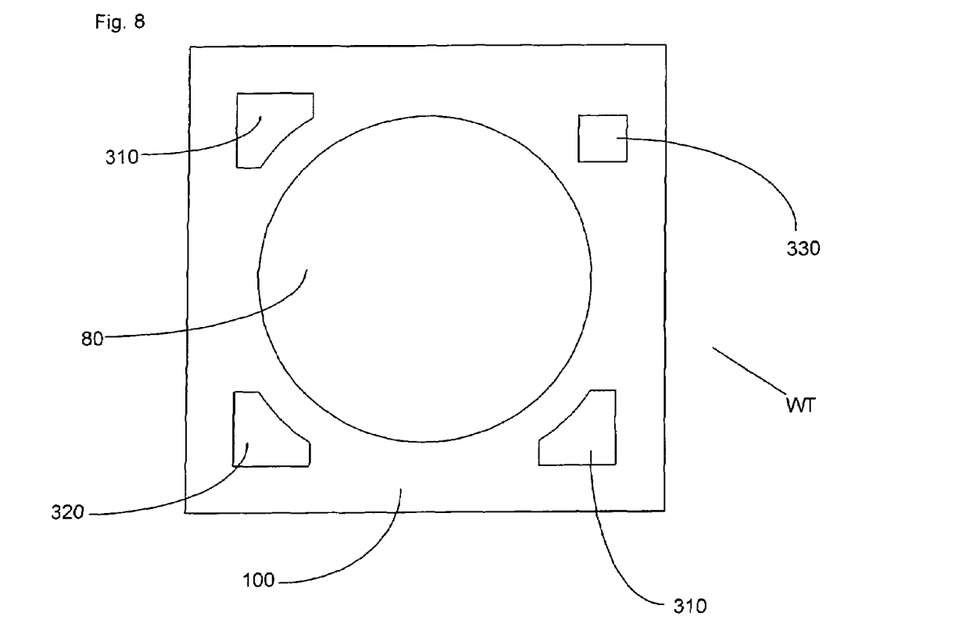
FIG. 8 depicts, in plan, a substrate table from above.

Since this substrate table WT is to be used in an immersion lithography apparatus in which liquid is provided between the projection system PS and the substrate W, the substrate table further comprises a cover plate 100 which is placed on the top surface of the substrate table body MB. The cover plate 100 provides a flat and continuous upper surface so that a liquid supply system of the localized area type (i.e. one which provides liquid to only a localized area of the substrate W at one time) can be used. Thus the top surface of the cover plate 100 is substantially co-planar with the top surface of the substrate W (and also with the top surface of any sensor which might be positioned in recesses in the top surface of the substrate table body MB, as is shown in FIG. 8 and described below). In an embodiment, the cover plate 100 may be integral to the substrate table body MB.

In order to reduce or prevent ingress of liquid into the recess 80 between the substrate support SS and the substrate table body MB, a seal projection 200 may be provided to extend between the bottom inner edge of the cover plate 100 and the top surface of the substrate support SS. The arrangement can be seen in detail in FIG. 7.

Figure 7:
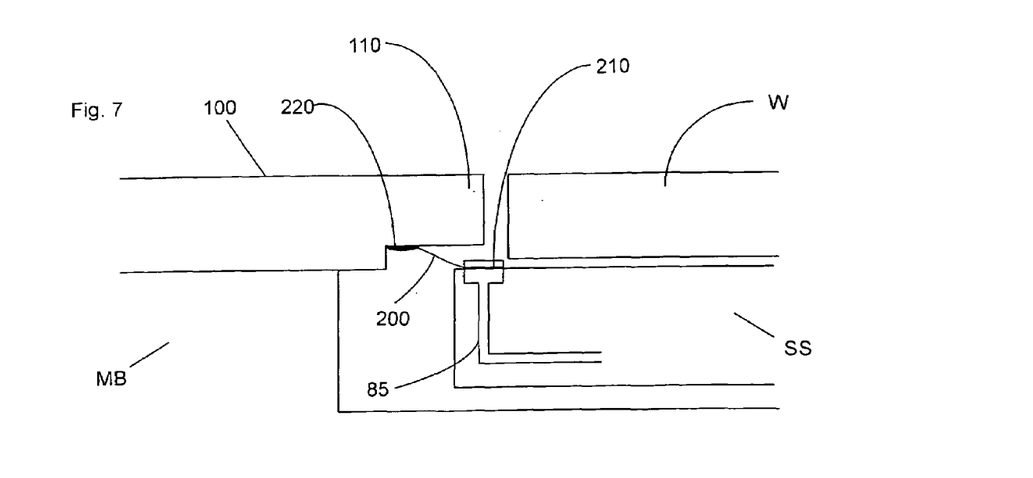
FIG. 7 depicts, in cross-section, a seal between a cover plate and a substrate support of a substrate table according to an embodiment of the present invention.

In an embodiment, it is useful that the substrate support SS may be removed from the substrate table body MB without major dismantling of the substrate table WT. For this reason, for example, a removable and/or deactiveatable seal projection 200 between the cover plate 100 and the substrate support SS may be provided. The cover plate 100 may also be removably mounted on the top surface of the substrate table body MB so that elements of the substrate table WT protected by the cover plate 100 may easily be serviced. The cover plate 100 comprises a cover plate projection 110 which is a so called edge seal member as is described in, for example, European Patent Application No. 04253354.7. The most basic form of this edge seal member is illustrated in FIG. 7. Other types of edge seal member and/or different configurations may also be used.

The seal projection 200 extends between the bottom surface of the cover plate 100, in an embodiment below the cover plate projection 110 as is illustrated, and the top surface of the substrate support SS. In an embodiment, the seal projection 200 extends around the whole periphery of the substrate support SS in one piece. This may be an optimum arrangement for liquid tightness. The material of the seal projection 200 is flexible such that forces in all directions, but particularly in the Z direction cannot be transmitted between the substrate table SS and the cover plate 100, i.e. the seal is decoupled from the cover plate 100 and the substrate support SS substantially in the direction of the optical axis of the lithographic apparatus. In an embodiment, the flexible seal will exert a maximum force of less than about 1N/m of the seal. One end of the seal projection 200 is attached to the cover plate by a bead of adhesive 220. Other ways of attaching the seal in a liquid tight manner may also be used. The other end of the seal projection 200 is attracted to the substrate support SS and releasably held there by a clamping device, in the illustrated example in the form of a low pressure inlet 85. The clamping device may be of any type, including, for example, an electromagnetic clamping device, an electrostatic clamping device and/or a removable adhesive. Thus, the cover plate may be removed and the seal projection 200 may be remotely activated or deactivated.

In order to achieve a good seal between the flexible seal projection 200 and the substrate support SS, a substantially non-flexible portion 210 (a portion that is at least less flexible than the flexible seal projection 200) is positioned at the free end of the seal projection 200 which protrudes from the cover plate 100. The non-flexible portion may, for example, be a metal part which is adhered to the top surface of the flexible material of the flexible seal projection 200. Thus, when the low pressure inlet 85 is activated, the flexible seal projection 200 will bend down so that the flexible material is clamped between the non-flexible member 210 and the low pressure inlet 85 to produce a good seal. In this way, the low pressure inlet 85 of the clamping device may be a totally dry low pressure inlet as liquid can be prevented from entering it. This is likely in contrast to the low pressure inlet used by the substrate support SS which may be a wet low pressure inlet (not illustrated) because such a good seal may not easily be achieved between the cover plate 100 and the substrate W and consequently liquid may enter the gap between the substrate W and the substrate support SS. The non-flexible portion 210 partly fills the gap between the flexible portion, the substrate support SS, cover plate 100 and the substrate W. In an embodiment, this gap is minimized for optimal performance of the liquid supply system.

In embodiment, the seal projection 200 and/or the non-flexible portion 210 is made of a polymeric flexible or elastic material which is resistant to the radiation of the lithographic apparatus. The seal projection 200 and/or the non-flexible portion 210 may also be made of metal. Even rubber may be used, for example, if the cover plate projection 110 protects the seal projection 200 and/or the non-flexible portion 210 from irradiation by the projection beam B.

In an embodiment, the non-flexible portion 210 may shield the seal projection 200 from the radiation of the projection beam B such that a material may be chosen for the seal projection 200 which is not resistant to the radiation of the projection system.

In an embodiment, the strength of the clamping device (the low pressure clamping device 85 in the embodiment) is about 25N/m to create a liquid tight seal with the material of the flexible seal projection 200 being rubber.

Figure 9:
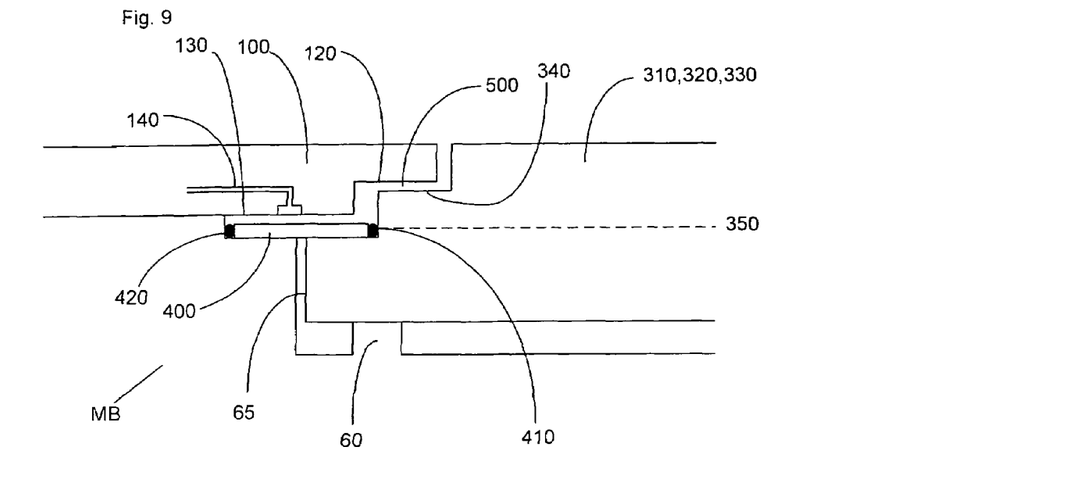
FIG. 9 illustrates, in cross-section, a seal formed between a substrate table body and a sensor of the substrate table of FIG. 8.

Further details of the substrate table WT according to an embodiment of the present invention are illustrated with reference to FIGS. 8 and 9. FIG. 8 is a view in plan of the top surface of the substrate table WT. What can be seen is the top surface of the cover plate 100 with various orifices. The central circular orifice is the orifice for the recess 80 in which the substrate support SS is positioned. Various components are positioned around the central orifice and which are capable of being illuminated by the projection beam B of the projection system PS. These various components may be one or more sensors, including, for example, two transmission image sensors (TIS) 310, a spot sensor 330 and an integrated lens interferometer (ILIAS) 320. In an embodiment, it is desirable that the cover plate 100 may be easily removed from the substrate table body MB but there should also be a good seal between the cover plate 100, one or more of the sensors 310, 320, 330 and the substrate table body MB. The arrangement shown in FIG. 9, is a cross-section through the edge of the cover plate 100 adjacent a sensor 310, 320, 330 and the substrate table body MB. In an embodiment, a good seal between the cover plate 100 and the sensor 310, 320, 330 could be established though not at the expense of serviceability (i.e., removability of the cover plate). Also, a disturbance traveling between the cover plate 100, the substrate table body MB and/or the sensor 310, 320, 330 should be minimized. For this reason, a dual layer seal construction is illustrated in which the bottom layer functions as a liquid tight seal and the upper layer is built as a constriction with the ability to remove any liquid which does enter the constriction.

The bottom layer of the seal has a seal structure 400, which in this case need not be flexible but could be flexible or stiff, positioned between the sensor 310, 320, 330 and the substrate table body MB. One or more steps are machined out of both the substrate table body MB and the sensor 310, 320, 330 on one of which the seal structure 400 is positioned. The seal structure 400 is adhered at each of its ends with a bead 410, 420 of adhesive to the substrate table body MB and the sensor 310, 320, 330. The adhesive is only applied at the ends of the seal structure 400 so that the seal structure 400 can undergo a small pivoting movement at each of its ends. Thus, the seal structure 400 is dimensioned so that it is narrower than the gap between the walls of the substrate table body MB and the sensor 310, 320, 330 to which it is adhered. In an embodiment, the seal structure 400 is machined from a single piece of material which extends around the entire periphery of the sensor 310, 320, 330. This bottom layer of the seal is liquid tight. In this way, the seal structure 400 is compliant in the Z direction and allows the sensor 310, 320, 330 to move in the Z direction independent of the substrate table body MB or the cover plate 100.

In an embodiment, the bottom step in the sensor 310, 320, 330 is at a position such that a neutral axis 350 of the sensor 310, 320, 330 is in the plane of the seal structure 400. The neutral axis of the sensor 310, 320, 330 is the axis about which forces can be applied which do not induce displacement and deformation of the sensor 310, 320, 330. In this way, any forces which are applied to the sensor 310, 320, 330 through the seal structure 400 do not work to tilt the sensor 310, 320, 330.

To protect the bead of adhesive 410, 420, particularly the inner bead 410, from illumination by the projection beam B and therefore possible degradation (since one or more of the sensors 310, 320, 330 may be illuminated by the projection beam B through the liquid), a projection 120 is provided around the inner periphery of the sensor orifice of the cover plate 100. This projection, in the form of a step 120, interacts with a complimentary step 340 in the sensor 310, 320, 330. A gap 500 between the projection 120 of the cover plate 100 and the step 340 of the sensor 310, 320, 330 is provided so that disturbance forces are not transmitted between the sensor 310, 320, 330 and the cover plate 100. However, the size of the gap 500 should be small (in an embodiment less than 0.3 mm, less than 0.1 mm or less than 0.05 mm) to provide a constriction through which liquid cannot easily pass. Liquid which does pass through the constriction 500 may be extracted by a low pressure inlet 140 positioned above the seal structure 400. The complimentary interlocking steps of the cover plate 100 and sensor 310, 320, 330 are such that a path from the top of the substrate table to the seal structure 400 is tortuous so as to making it difficult for liquid to pass.

Although the two types of seal have been discussed herein in relation to sealing between the cover plate 100 and the substrate support SS and the substrate table body MB and a sensor 310, 320, 330, these are examples only and the types of seal discussed herein may be used to seal between any two parts of, in or on the substrate table and/or between the substrate table and the substrate W.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a table;
a seal structure located between an object and the table, the seal structure configured to create a seal between the object and a part of the table; and
an adhesive applied to at least one end of the seal structure such that the seal structure is configured to undergo a pivoting movement at the at least one end via the adhesive, and the seal structure comprises a substantially non-flexible portion and a flexible portion, wherein the non-flexible portion is between the adhesive and the other end of the seal structure and the flexible portion comprises the adhesive.

2. The lithographic apparatus according to claim 1, comprising the object, the object being one of a substrate support or a sensor.

3. The lithographic apparatus according to claim 1, wherein the seal structure is removable from the object, the part of the table, or both.

4. The lithographic apparatus according to claim 1, wherein the object is a substrate support and the substrate support is integral with the table.

5. The lithographic apparatus according to claim 1, wherein the part of the table is a cover plate configured to cover a portion of a top surface of the table and to be substantially co-planar with a top surface of a substrate supported by the table.

6. The lithographic apparatus according to claim 1, further comprising a projection, the projection arranged so that in use the projection substantially shields the seal structure, the adhesive, or both, from radiation of the apparatus.

7. The lithographic apparatus according to claim 1, further comprising:
a projection system configured to project a patterned radiation beam onto a target portion of the substrate; and
a liquid supply system configured to at least partly fill a space between the projection system and the substrate with a liquid.

8. The lithographic apparatus according to claim 1, wherein the seal structure substantially extends around the whole periphery of the object.

9. The lithographic apparatus according to claim 1, wherein a gap is provided between the object and the part of the table.

10. The lithographic apparatus according to claim 9, wherein the gap is less than about 0.3 mm.

11. The lithographic apparatus according to claim 1, wherein the seal structure is narrower than a gap between the object and the part of the table.

12. The lithographic apparatus according to claim 1, further comprising a low pressure inlet located proximate to the seal structure that is configured to remove liquid in the vicinity of the seal structure.

13. The lithographic apparatus according to claim 1, wherein a path between a top surface of the table to the seal structure is tortuous.

14. A device manufacturing method, comprising:
projecting a beam of radiation onto a substrate, wherein a seal structure is located between an object and a part of a table, at least one end of the seal structure being adhered to a part of the table by an adhesive such that the seal structure is configured to undergo a pivoting movement at the at least one end via the adhesive, and the seal structure comprises a substantially non-flexible portion and a flexible portion, wherein the non-flexible portion is between the adhesive and the other end of the seal structure and the flexible portion comprises the adhesive.

15. The method according to claim 14, wherein the object is a substrate support or a sensor.

16. A lithographic apparatus, comprising:
a table; and
a planar seal structure located between an object and the table and configured to create a seal between the object and a part of the table, a neutral axis of the object passing through the object and being substantially in a plane of the planar seal structure, wherein a height of the planar seal structure is smaller than a height of the object, the heights being perpendicular to the neutral axis.

17. The lithographic apparatus according to claim 16, wherein the object is a substrate support or a sensor.

18. A device manufacturing method, comprising:
projecting a beam of radiation onto a radiation-sensitive substrate, wherein a planar seal structure is located between an object and a part of a table, the planar seal structure creating a seal between the object and a part of the table and a neutral axis of the object passing through the object and being substantially in a plane of the planar seal structure, wherein a height of the planar seal structure is smaller than a height of the object, the heights being perpendicular to the neutral axis.

19. The method according to claim 18, wherein the object is a substrate support or a sensor.

* * * * *